(12) United States Patent
Dosaka

(10) Patent No.: US 9,991,849 B2
(45) Date of Patent: Jun. 5, 2018

(54) WIRELESS COMMUNICATION DEVICE AND POWER SOURCE DEVICE

(71) Applicant: Hitachi Kokusai Electric Inc., Tokyo (JP)

(72) Inventor: Junya Dosaka, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days. days.

(21) Appl. No.: 15/512,653

(22) PCT Filed: Sep. 29, 2014

(86) PCT No.: PCT/JP2014/075897
§ 371 (c)(1),
(2) Date: Mar. 20, 2017

(87) PCT Pub. No.: WO2016/051463
PCT Pub. Date: Apr. 7, 2016

(65) Prior Publication Data
US 2017/0294879 A1    Oct. 12, 2017

(51) Int. Cl.
*H01Q 11/12*    (2006.01)
*H04B 1/04*    (2006.01)
(Continued)

(52) U.S. Cl.
CPC .............. *H03F 1/02* (2013.01); *H03F 3/19* (2013.01); *H03F 3/2175* (2013.01); *H04B 1/40* (2013.01);
(Continued)

(58) Field of Classification Search
CPC ... H03G 3/3042; H04W 52/028; H03F 1/0211
(Continued)

(56) References Cited

U.S. PATENT DOCUMENTS 6,374,127 B1 * 4/2002 Park .................. H04W 52/0274
455/572
6,760,604 B2 * 7/2004 Leizerovich .......... H03F 1/0211
330/279
(Continued)

FOREIGN PATENT DOCUMENTS

JP    61-256825 A    11/1986
JP    2013-055449 A    3/2013
(Continued)

OTHER PUBLICATIONS

International Search Report of PCT/JP2014/075897 dated Nov. 25, 2014.
(Continued)

*Primary Examiner* — Simon Nguyen
(74) *Attorney, Agent, or Firm* — Mattingly & Malur, PC

(57) ABSTRACT

A wireless communication device configured to prevent a transmission time period for sending a wireless signal and a receiving time period for receiving a wireless signal from being overlap, comprises: a transmitter that includes an orthogonal modulator that orthogonally modulates an IQ-modulated modulation signal and a transmission power amplifier that power-amplifies the orthogonally modulated signal; a receiver that includes a demodulator that demodulates a received signal; a first power source that is the power source for the transmission power amplifier and the receiver; and a second power source that is the power source for the orthogonal modulator; and a controller which outputs the modulation signal to the orthogonal modulator. The first power source outputs a constant voltage to the receiver during the receiving time period, and outputs, during the transmission time period, to the transmission power amplifier, a fluctuating voltage according to an envelope of the modulation signal.

2 Claims, 7 Drawing Sheets

(51) Int. Cl.
    *H04B 1/38*     (2015.01)
    *H04M 1/00*     (2006.01)
    *H03F 1/02*     (2006.01)
    *H03F 3/19*     (2006.01)
    *H03F 3/217*     (2006.01)
    *H04B 1/40*     (2015.01)

(52) U.S. Cl.
    CPC .. *H03F 2200/102* (2013.01); *H03F 2200/294* (2013.01); *H03F 2200/451* (2013.01)

(58) Field of Classification Search
    USPC .......................... 455/127.1, 522, 550.1, 572
    See application file for complete search history.

(56) References Cited

U.S. PATENT DOCUMENTS

| | | | | |
|---|---|---|---|---|
| 7,623,896 B2* | 11/2009 | Tanaka | ................ | H03G 1/0088 330/297 |
| 8,050,722 B2* | 11/2011 | Kimata | ................ | H03F 1/0205 455/115.1 |
| 2003/0198300 A1* | 10/2003 | Matero | ................ | H03F 1/0227 375/297 |
| 2009/0004981 A1* | 1/2009 | Eliezer | ................ | H03F 1/0211 455/127.1 |
| 2009/0253385 A1* | 10/2009 | Dent | ................ | H04B 1/0458 455/83 |
| 2014/0167843 A1* | 6/2014 | Asensio | ................ | H03F 1/02 330/127 |

FOREIGN PATENT DOCUMENTS

| | | |
|---|---|---|
| KR | 20-2010-0006253 U | 6/2010 |
| WO | 2011/148939 A1 | 12/2011 |

OTHER PUBLICATIONS

Translation of Korean Office Action received in corresponding Korean Application No. 10-2017-7004202 dated Jun. 29, 2017.

* cited by examiner

WIRELESS COMMUNICATION DEVICE AND POWER SOURCE DEVICE

TECHNICAL FIELD

The present invention relates to a technology for reducing power consumed by the wireless communication device.

BACKGROUND ART

Generally, the wireless communication device of FDMA (Frequency-Division Multiple Access) type, and SCPC (Single Channel Per Carrier) type has employed ET (Envelope Tracking) method for the purpose of reducing power consumption.

The ET method is designed to change the power supply voltage of the power amplifier of the transmitter in accordance with output power of the power amplifier. For example, the envelope information (Envelope) is taken from the modulation signal, in accordance with which the power supply voltage of the power amplifier is changed. This allows the power amplifier to be operated in the nearly saturated state. The method may improve efficiency of the power amplifier and lessen the power loss compared with the case where the power supply voltage is fixed.

Meanwhile, generally, the wireless communication device of TDMA (Time-Division Multiple Access)/TDD (Time Division Duplex) type does not employ the ET method because of the following reasons. Firstly, the ET method is employed for the power amplifier of the transmitter, and the transmission time period for the device of TDMA/TDD type is shorter than that of FDMA type and SCPC type. The resultant effective power consumption of the power amplifier is low. For example, the transmission time period in the case of the device of TDMA/TDD type is 25% of the transmission time period in the case of the device of SCPC type which constantly executes transmission. Accordingly, the power consumption of the device of TDMA/TDD type becomes 25% of that of the device of SCPC type.

Secondly, the ET power source unit for supplying power to the power amplifier has to be provided in addition to the generally employed power source unit so as to use the ET method for the power amplifier. The space occupied by the ET power source unit in the mobile type wireless communication device may interfere with size reduction of such wireless communication device. For example, the generally employed power source unit includes a transmission power source unit for supplying power to the transmission circuit, a receiving power source unit for supplying power to a receiving circuit, and a control power source unit for supplying power to a control circuit.

Due to the above reasons, the device of TDD type does not employ the ET method. Recently, however, extension of the battery operable time has been increasingly viewed as important for the portable wireless communication device represented by the mobile wireless device from the disaster prevention perspective. Therefore, power consumption reduction is also viewed as important for the wireless communication device of TDD type.

The following patent literature 1 describes the technology for improving power efficiency by supplying power from the ET power source unit to the power amplifier of the transmitter.

CITATION LIST

Patent Literature

PTL 1: Japanese Patent Application Laid-Open No. 2013-55449

SUMMARY OF INVENTION

Technical Problem

It is an object of the present invention to provide the ET technology which allows power consumption reduction of the wireless communication device while suppressing increase in the space occupied by the power source unit.

Solution to Problem

Aiming at solving the above-described problem, the representative structure of the wireless communication device according to the present invention will be described as below.

A wireless communication device configured to prevent a transmission time period for sending a wireless signal, and a receiving time period for receiving the wireless signal from being overlapped includes a transmitter which includes an orthogonal modulator that orthogonally modulates an IQ-modulated modulation signal, and a transmission power amplifier that power-amplifies the orthogonally modulated signal, a receiver which includes a demodulator that demodulates a received signal and outputs a demodulation signal, a first power source serving as a power source for the transmission power amplifier and the receiver, a second power source serving as a power source for the orthogonal modulator, and a controller which outputs the modulation signal to the orthogonal modulator, to which the demodulation signal is input from the demodulator. The first power source outputs a constant voltage to the receiver in the receiving time period, and, in the transmission time period, outputs a fluctuation voltage in accordance with an envelope of the modulation signal to the transmission power amplifier.

The representative structure of the power source device according to the present invention will be described as below.

A power source device is configured to receive inputs of a fluctuation signal having its value fluctuated, and a switching signal, and, based on the switching signal, switch between a fluctuation voltage having its value fluctuated in accordance with the fluctuation signal, and a constant voltage for outputting the switched voltage.

Advantageous Effects of Invention

The aforementioned structures allow power consumption reduction of the wireless communication device while suppressing increase in the space occupied by the power source.

DESCRIPTION OF EMBODIMENTS

An embodiment of the present invention will be described hereinafter.

Figure 1:
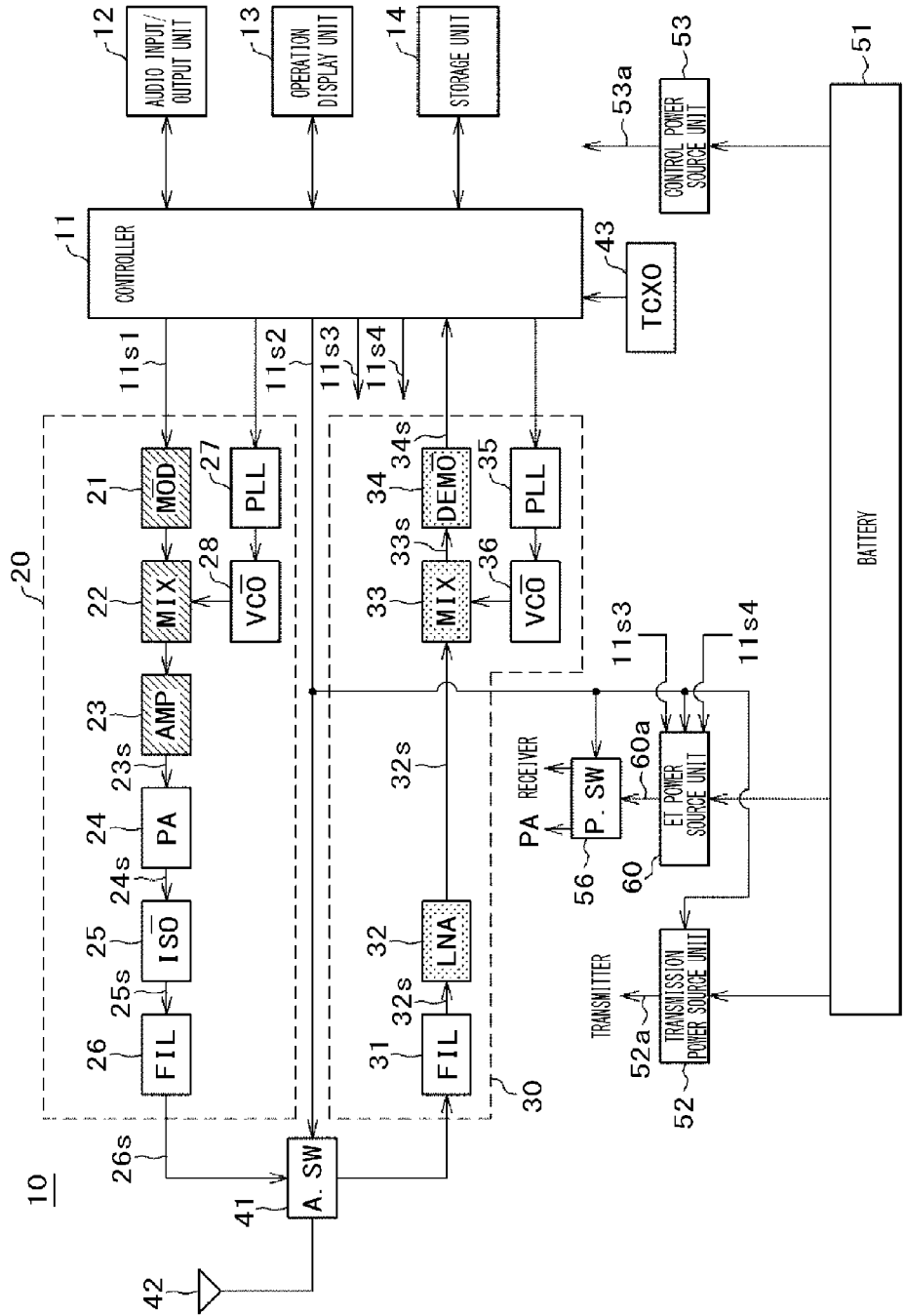
FIG. 1 is a block diagram of a wireless communication device according to an embodiment of the present invention.

FIG. 1 is a block diagram of a wireless communication device according to an embodiment of the present invention. A wireless communication device 10 of the embodiment is in the form of the portable wireless communication device of TDMA/TDD type, and includes a controller 11, an audio input/output unit 12, an operation display unit 13, a storage unit 14, a transmitter 20, a receiver 30, an antenna switch 41, a transmission/receiving antenna 42, a battery 51, an ET power source unit 60, a transmission power source unit 52, a control power source unit 53, a power switch 56, and a TCXO (temperature compensated crystal oscillator) 43.

The wireless communication device 10 of TDD type is configured to repeat a transmission time period Ts taken for the wireless communication device 10 to send the wireless signal, and a receiving time period Tr taken for the wireless communication device 10 to receive the wireless signal. That is, the device is configured to set the transmission time period and the receiving time period separately so as not to be overlapped with each other.

In the embodiment, a gap time (gap time period) Tg is set between the transmission time period Ts and the receiving time period Tr. The gap time Tg is set for preparation of switching between the transmission time period Ts and the receiving time period Tr. For example, each of the transmission time period Ts, the receiving time period Tr, and the gap time Tg is set to 10 ms, respectively.

The audio input/output unit 12 is configured to have the microphone for converting the input sound into an electric signal, and a speaker for outputting the electric signal as the sound.

The operation display unit 13 includes an operation unit for accepting an input of the operator's instruction, and a display unit for displaying the respective data. The operation unit is configured to include, for example, a PTT (Push To Talk) button, and a keypad with numeric key. The display unit is configured to include a liquid crystal display (LCD), for example. The operation display unit 13 may be a touch panel formed by integrating the operation unit and the display unit.

The storage unit 14 includes a semiconductor memory (flash memory, RAM (Random Access Memory), ROM (read only memory) and the like), and a magnetic disk for storage of various data.

The controller 11 converts the audio signal input from the microphone of the audio input/output unit 12 into the digital signal so as to be subjected to the sound encoding process. The controller then digitally modulates (IQ modulates) the sound encoded audio signal so as to generate the I signal and Q signal. The thus generated I signal and Q signal are analog-converted, and output to the transmitter 20 in the form of a modulation signal $11s1$. As described above, the modulation signal $11s1$ is derived from IQ modulation of the transmission signal such as the audio signal.

The controller 11 digitally converts a demodulation signal $34s$ output from the receiver 30, and then executes the process such as sound decoding process. The sound decoded audio signal is analog-converted so that the resultant signal is output to the speaker of the audio input/output unit 12.

The controller 11 outputs a switch control signal $11s2$ indicating the transmission time period Ts. For example, the switch control signal $11s2$ is set to "1" in the transmission time period Ts, and set to "0" in the time period other than the transmission time period Ts. The switch control signal $11s2$ is an identification signal indicating whether or not current time corresponds to the transmission time period Ts.

The controller 11 calculates each envelope of the I signal and the Q signal therefrom as described above in the gap time Tg immediately before the transmission time period Ts, generates an envelope signal $11s3$ in the transmission time period Ts, and outputs the signal to the ET power source unit 60 in synchronization with the corresponding I and Q signals. The envelope signal $11s3$ indicating the envelope of the modulation signal $11s1$ may be derived from $((\text{amplitude of I signal})^2 + (\text{amplitude of Q signal})^2)^{1/2}$.

The controller 11 generates a constant voltage generation pulse signal $11s4$ for setting an output $60a$ of the ET power source unit 60 to the voltage with predetermined value in the receiving time period Tr, and outputs the signal to the ET power source unit 60. The constant voltage generation pulse signal $11s4$ is the pulse signal for generating the constant voltage output to the receiver 30. The pulse width and cycle of the constant voltage generation pulse signal $11s4$ are preliminarily examined and set so that the output $60a$ of the ET power source unit 60 becomes the constant voltage with predetermined value.

The controller 11 is provided with hardware including CPU (Central Processing Unit) and a memory that stores the operation program for the controller 11. The CPU may be configured to generate the clock signal for processing in the CPU by means of the reference clock signal from the TCXO 43. The CPU is operated in accordance with the operation program using the thus generated processing clock signal. The controller 11 may be provided with a DSP (Digital Signal Processor), and an FPGA (Field Programmable Gate Array) for assisting the process executed by the CPU.

The transmitter 20 includes an orthogonal modulator (MOD) 21, a transmission mixer (MIX) 22, a preamplifier (AMP) 23, a transmission power amplifier (PA) 24, an isolator (ISO) 25, a transmission filter (FIL) 26, a transmission PLL (phase locked loop: phase synchronization circuit) 27, and a transmission VCO (Voltage Controlled Oscillator) 28.

The orthogonal modulator 21 executes analog orthogonal modulation of the modulation signal $11s1$ (analog-converted I signal and Q signal) as the transmission signal IQ-modulated in the controller 11 and output therefrom, and outputs the orthogonally modulated transmission signal to the transmission mixer 22. The modulation signal $11s1$ is generated based on, for example, the audio signal input from the microphone of the audio input/output unit 12.

The transmission mixer 22 mixes a carrier signal output from the transmission VCO 28, and the modulation signal output from the orthogonal modulator 21 (that is, multiplication), and outputs the mixed transmission signal to the preamplifier 23. The preamplifier 23 amplifies the transmission signal output from the transmission mixer 22.

The transmission VCO 28 generates the carrier signal at predetermined frequency under control of the transmission PLL 27. The transmission PLL 27 controls the transmission VCO 28 so as to establish the output thereof at predetermined frequency based on the frequency commanded by the controller 11.

The transmission power amplifier 24 power-amplifies a transmission signal 23s output from the preamplifier 23. At this time, the transmission power amplifier 24 receives power supplied from the ET power source unit 60. Specifically, power for the transmission power amplifier 24 is supplied from the ET power source unit 60 only in the transmission time period Ts via the power switch (P.SW) 56. In the transmission time period Ts, the transmitter 20 except the transmission power amplifier 24 receives power from the transmission power source unit 52.

The isolator 25 prevents reverse proceeding of a transmission signal 24s output from the transmission power amplifier 24. The transmission filter 26 eliminates unnecessary frequency components from the transmission signal 25s output from the isolator 25. A transmission signal 26s output from the transmission filter 26 is radiated into the air as a wireless signal (radio wave) from the transmission/receiving antenna 42 via the antenna switch 41.

The transmission/receiving antenna 42 is an antenna for transmitting and receiving the wireless signal to/from the other wireless communication device and the base station apparatus. The antenna switch 41 executes switching and connection of the transmission/receiving antenna 42 between the transmission time period Ts and the receiving time period Tr. The antenna switch 41 switches the transmission/receiving antenna 42 between the one for transmission and the one for receiving based on the switch control signal 11s2 output from the controller 11.

Specifically, the antenna switch 41 connects the output of the transmission filter 26 and the transmission/receiving antenna 42 in the transmission time period Ts, and connects the input of the receiving filter 31 and the transmission/receiving antenna 42 in the receiving time period Tr as described below.

The receiver 30 is configured to include a receiving filter (FIL) 31, a receiving power amplifier (LNA) 32, a receiving mixer (MIX) 33, a demodulator (DEMO) 34, a receiving PLL 35, and a receiving VCO 36.

The transmission/receiving antenna 42 receives the wireless signal from the other wireless communication device and the base station apparatus, and outputs the received signal to the receiving filter 31 via the antenna switch 41. The receiving filter 31 eliminates the unnecessary frequency components from the received signal received by the transmission/receiving antenna 42. The receiving power amplifier 32 amplifies the received signal 31s output from the receiving filter 31.

The receiving mixer 33 mixes (that is, multiplication) the signal of the carrier frequency output from the receiving VCO 36, and the received signal 32s output from the receiving power amplifier 32, and eliminates the carrier from the received signal 32s. Then a received signal 33s having the carrier eliminated is output to the demodulator 34.

The receiving VCO 36 generates a signal at the same frequency as that of the carrier under the control of the receiving PLL 35. The receiving PLL 35 controls the receiving VCO 36 based on the frequency commanded by the controller 11 so as to establish the output of the receiving VCO 36 at the predetermined frequency.

The demodulator 34 demodulates the received signal 33s output from the receiving mixer 33, and outputs the demodulation signal (analog I signal and Q signal) that has been demodulated to the controller 11. The controller 11 digitally converts the demodulation signal 34s output from the demodulator 34, executes sound decoding for conversion into the audio signal, and further executes analog conversion so that the resultant signal is output to the speaker of the audio input/output unit 12.

The battery 51 is a power source device which supplies power to the wireless communication device 10 to be operated, which may be constituted by the lithium-ion battery, for example. The battery 51 supplies power to the ET power source unit 60, the transmission power source unit 52, and the control power source unit 53 at DC (direct current) voltage of 12 volts.

The ET power source unit 60 is the power source device which outputs power at 12 volts supplied from the battery 51 through voltage conversion as an ET power source unit output 60a. The ET power source unit output 60a serves as the power source for the power amplifier 24 and the receiver 30.

Specifically, as described above, the ET power source unit 60 outputs the ET (envelope tracking) voltage that fluctuates in accordance with the envelope of the modulation signal 11s1 to the transmission power amplifier 24 via the power switch 56 only in the transmission time period Ts. In other words, only in the transmission time period Ts, the ET power source unit output 60a serves as the power source for the transmission power amplifier 24. In the transmission time period Ts, the power source for the transmission power amplifier 24 is brought into the voltage in accordance with the envelope of the modulation signal 11s1, that is, power consumed by the transmission power amplifier 24.

The ET power source unit 60 outputs the constant voltage with the fixed value (for example, 5 volts) to the receiver 30 via the power switch 56 in the receiving time period Tr. That is, in the receiving time period Tr, the ET power source unit output 60a serves as the power source for the receiver 30. More specifically, in the receiving time period Tr, the ET power source unit 60 supplies power to the receiving power amplifier 32, the receiving mixer 33, and the demodulator 34, which constitute the power consuming structure. The receiving filter 31 does not consume power. The control power source unit 53 supplies power to the receiving PLL 35, and the receiving VOC 36, which will be described later.

The power switch 56 outputs the ET power source unit output 60a to the transmission power amplifier (PA) in the transmission time period Ts (that is, when the switch control signal 11s2 is set to "1"), and to the receiver 30 (specifically, the receiving power amplifier 32, the receiving mixer 33, and the demodulator 34) in the receiving time period Tr (that is, when the switch control signal 11s2 is set to "0"). The power switch 56 may be configured to be included in the ET power source unit 60.

In the gap time Tg immediately after the transmission time period Ts, the ET power source unit 60 switches the ET power source unit output 60a from the ET voltage for the transmission time period Ts to the constant voltage for the receiving time period Tr. In the gap time Tg immediately after the receiving time period Tr, the ET power source unit 60 switches the ET power source unit output 60a from the constant voltage for the receiving time period Tr to the ET voltage for the transmission time period Ts.

If the gap time Tg is long, the ET power source unit 60 may be configured to temporarily stop power supply. In such a case, the power source supply has to be resumed to allow timely start of the transmission time period Ts or the receiving time period Tr subsequent to the long gap time Tg.

The transmission power source unit 52 converts the power at DC 12 volts supplied from the battery 51 into the DC 5 volts, for example. As described above, in the transmission time period Ts, power is supplied to the transmitter 20 except the transmission power amplifier 24. Specifically, in the transmission time period Ts, the transmission power source unit 52 supplies power to the orthogonal modulator 21, the transmission mixer 22, and the preamplifier 23, which constitute the power consuming structure through an output 52a. The isolator 25 and the transmission filter 26 do not consume power. The control power source unit 53 supplies power to the transmission PLL 27 and the transmission VCO 28 as described below.

The embodiment is configured to supply power from the transmission power source unit 52 to the orthogonal modulator 21, the transmission mixer 22, and the preamplifier 23 only in the transmission time period Ts. This makes it possible to suppress power consumption of the transmission power supply unit 52. As the power consumption of the transmission power source unit 52 in the time period other than the transmission time period Ts is small, it is possible, for example, to allow the transmission power source unit 52 to supply power in the receiving time period Tr or to supply power constantly.

The control power source unit 53 converts DC 12-volt power supplied from the battery 51 into DC 3.3-volt power, for example, and constantly supplies DC 3.3-volt power to the controller 11, the audio input/output unit 12, the operation display unit 13, and the storage unit 14 through an output 53a.

The control power source unit 53 constantly supplies DC 3.3-volt power to the transmission PLL 27, the transmission VCO 28, the receiving PLL 35, the receiving VCO 36, and the TCXO 43 on the ground that the transmission PLL 27 and the transmission VCO 28 have to be operated in the time period other than the transmission time period Ts, and the receiving PLL 35 and the receiving VCO 36 have to be operated in the time period other than the receiving time period Tr.

It is also possible to provide the power source unit for supplying power to the transmission PLL 27, the transmission VCO 28, the receiving PLL 35, the receiving VCO 36, and the TCXO 43 in addition to the power source unit for supplying power to the controller 11, the audio input/output unit 12, the operation display unit 13, and the storage unit 14.

As for the power consumption ratio of the respective power source units, the ratio of the control power source unit 53 is 40%, the ratio of the transmission power source unit 52 is 10%, the ratio of the ET power source unit 60 in transmission is 50%, and the ratio of the ET power source unit 60 in receiving is 10%.

Figure 2:
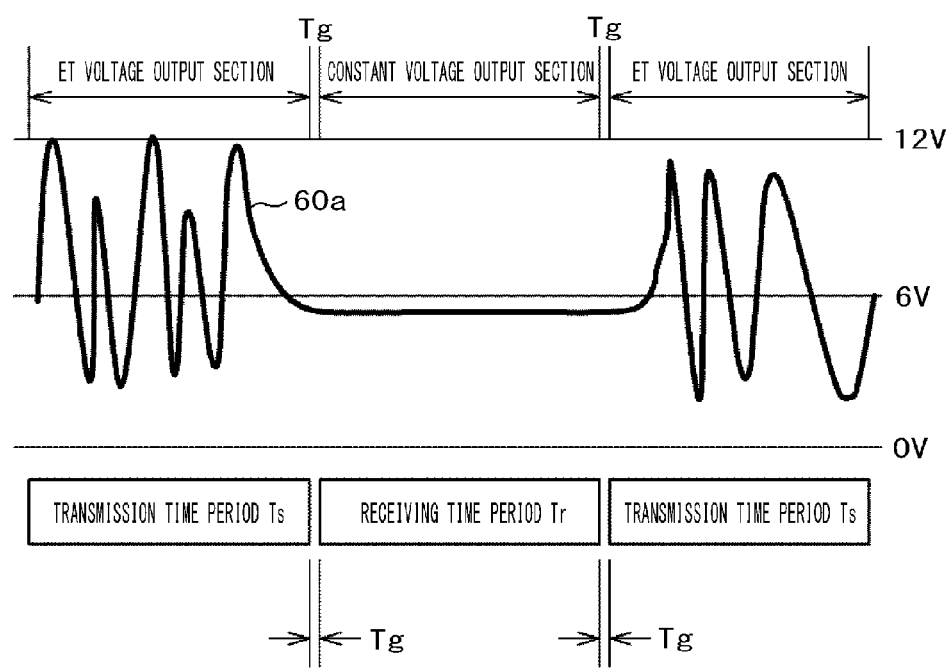
FIG. 2 is a conceptual view of an output waveform of an ET power source unit according to the embodiment of the present invention.

FIG. 2 is a conceptual view of the output waveform of the ET power source unit according to the embodiment of the present invention. The Y-axis represents magnitude (voltage value) of the ET power source unit output 60a, and X-axis represents time. FIG. 2 shows how the ET power source unit output 60a varies with time elapsing the transmission time period, the receiving time period Tr, and the transmission time period Ts again. The gap time Tg is set between the transmission time period Ts and the receiving time period Tr.

As described above, in the transmission time period Ts, the ET power source unit output 60a is shaped into the waveform corresponding to the envelope signal 11s3. In other words, the transmission time period Ts corresponds to the ET (Envelope Tracking) voltage output section. Referring to the example as shown in FIG. 2, in the transmission time period Ts, the ET power source unit output 60a fluctuates in the range from approximately 12 volts to approximately 2 volts. The power source voltage of the transmission power amplifier 24 having the waveform in accordance with the envelope signal 11s3 allows improvement in efficiency of the transmission power amplifier 24 as well as power loss reduction.

The ET voltage as the ET power source unit output 60a in the transmission time period Ts includes the voltage with the waveform not only analogous but also approximate to the envelope signal 11s3. The voltage corresponding to the envelope signal 11s3 includes the voltage not only analogous but also approximate to the envelope signal 11s3.

Preferably, the ET voltage is analogous to the envelope signal 11s3, which is not limited thereto. The efficiency of the transmission power amplifier 24 may be improved while reducing power loss to a certain degree so long as it is approximate to the envelope signal 11s3 if not analogous. The ET power source unit output 60a approximate to the envelope signal 11s3 represents the state in which the ET power source unit output 60a has the peak analogously to the peak of the envelope signal 11s3, and the ET power source unit output 60a has the trough analogously to the trough of the envelope signal 11s3. It is possible to lessen the power loss to a certain extent so long as the ET power source unit output 60a in the transmission time period Ts is at least analogous to the envelope signal 11s3 closer than the ET power source unit output 60a (constant voltage) in the receiving time period Tr.

In the receiving time period Tr, the ET power source unit output 60a shows the substantially fixed voltage value. Referring to the example as shown in FIG. 2, the ET power source unit output 60a shows the constant voltage at approximately 5 volts. In other words, the receiving time period Tr corresponds to the constant voltage output section. The constant voltage includes small voltage fluctuation in the range where the receiver 30 is normally operated.

In the gap time Tg, the ET power source unit output 60a is switched from the ET voltage for the transmission time period Ts to the constant voltage for the receiving time period Tr, or from the constant voltage for the receiving time period Tr to the ET voltage for the transmission time period Ts. As the time period required for the aforementioned switching operation is considerably short (at least shorter than the gap time Tg), the EG power source unit output 60a has continuous waveforms in the switching operation as indicated by FIG. 2.

Conventionally, the ET power source unit supplies power only to the power amplifier of the transmitter. If the transmitter is subjected to TDD operation (or intermittent operation) in the aforementioned case, the load from the aspect of the ET power source unit (input impedance of the power amplifier) will sharply fluctuate. Therefore, it is difficult for the ET power source unit to implement stable voltage supply, namely, it is difficult to improve efficiency of the power amplifier.

Figure 7:
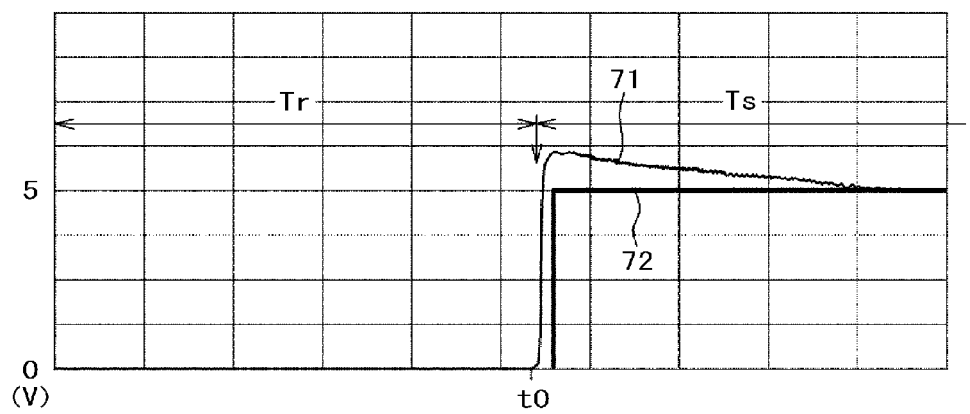
FIG. 7 is an example of the output waveform of the ET power source unit according to a prior art.

FIG. 7 shows an example of the output waveform of the ET power source unit according to the prior art. Referring to FIG. 7, Y-axis denotes voltage, and X-axis denotes time. The actual output of the ET power source unit is designated by 71. The output of the ET power source unit expectedly in proper state is designated by 72. As a rising part of the output 72 is overlapped with that of the output 71, the time axis is slightly shifted rightward for clear visualization.

As FIG. 7 shows, the ET power source unit according to the prior art supplies power to the power amplifier of the transmitter only in the transmission time period Ts. Accordingly, in transition from the receiving time period Tr to the transmission time period Ts, the output 71 of the ET power source unit rises toward the predetermined voltage value (for example, 5 volts) from 0 volt at a starting time point t0 of the transmission time period Ts. At this time, because of overshoot under the influence of inductance in the ET power source unit, the output 71 exceeds the output 72 that is expectedly in proper state. After an elapse of prescribed time, the output is converged into the predetermined voltage value. Therefore, it is difficult for the ET power source unit to supply power with appropriate magnitude in the stable state, that is, difficult to improve efficiency of the power amplifier.

Meanwhile, the ET power source unit 60 according to the embodiment supplies constant voltage power to the receiver 30 both in the receiving time period Tr, and in the standby state before start of communication (step S1 of FIG. 6 to be described later). The output hardly rises from 0 volt upon start of the transmission time period Ts. Compared with the prior art, the ET power source unit 60 according to the embodiment is capable of significantly lessening the overshoot at the start of the transmission time period Ts. As a result, the power amplification efficiency may be improved in the transmission time period Ts, especially from the initial stage.

Figure 3:
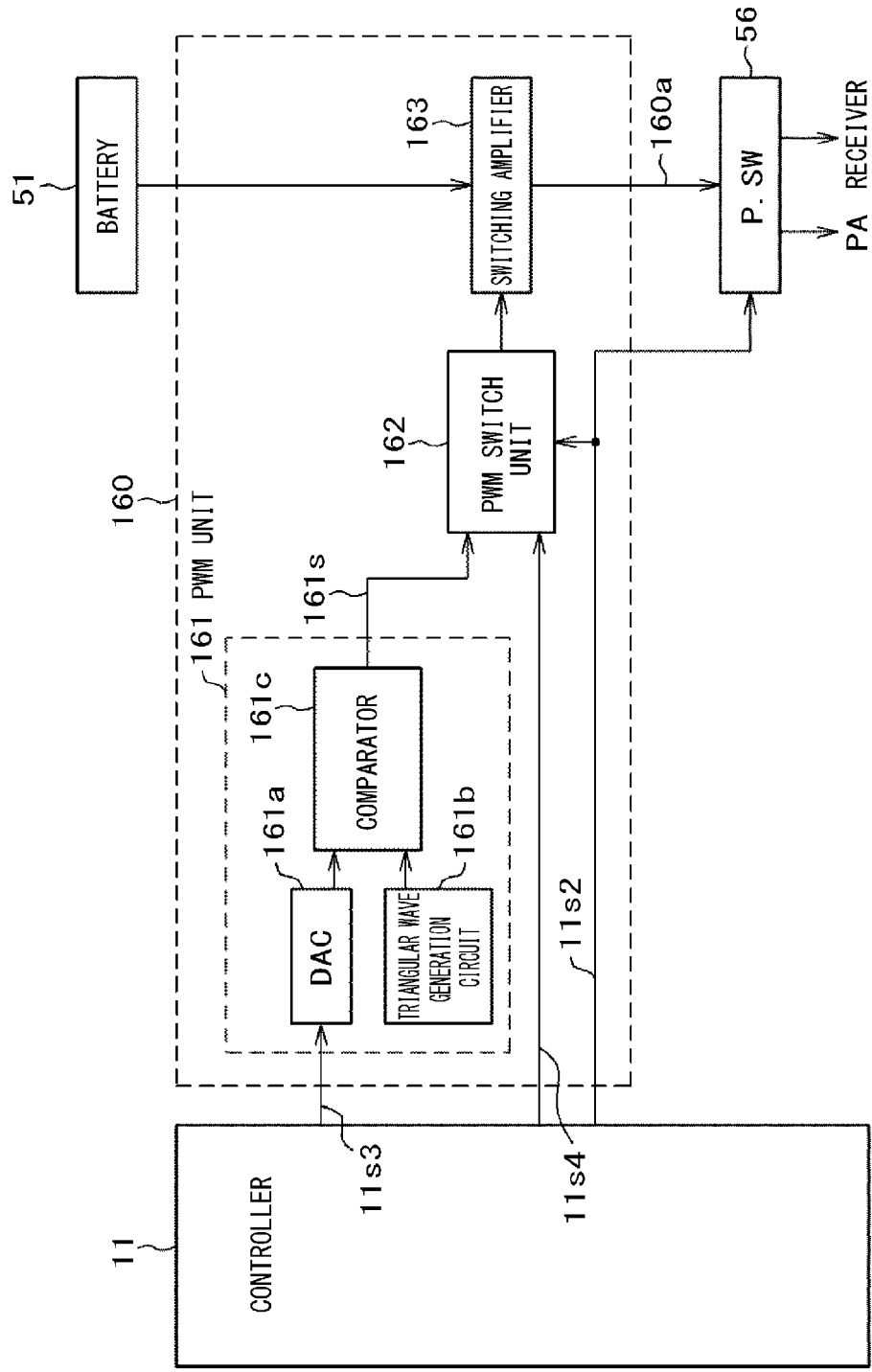
FIG. 3 is a block diagram of the ET power source unit as a first example according to the embodiment of the present invention.

FIG. 3 is a block diagram of the ET power source unit according to a first example of the embodiment.

As FIG. 3 shows, an ET power source unit 160 according to the first example corresponds to the ET power source unit 60 as shown in FIG. 1, and includes a fluctuation voltage generation pulse signal generation unit (PWM unit) 161, a pulse switch (PWM switch unit) 162, and a switching amplifier 163. The structures and signals which are the same as those shown in FIG. 1 will be designed with the same codes, and explanations thereof, thus will be omitted. The term PWM stands for Pulse Width Modulation.

The ET power source unit 160 obtains the switch control signal 11s2, the envelope signal 11s3, and the constant voltage generation pulse signal 11s4 from the controller 11. The constant voltage generation pulse signal 11s4 is derived from the controller 11 as indicated by an example of FIG. 3. However, the signal may be derived from an arbitrary unit other than the controller 11. For example, it may be generated in the ET power source unit 160.

Upon input of the pulse signal, the switching amplifier 163 generates and outputs the voltage in accordance with the pulse width of the input pulse signal. The fluctuation voltage generation pulse signal generation unit 161 generates and outputs a fluctuation voltage generation pulse signal 161s for the purpose of allowing the switching amplifier 163 to generate the ET voltage (fluctuation voltage in accordance with the envelope of the modulation signal 11s1) based on the envelope signal 11s3. The fluctuation voltage generation pulse signal 161s is the pulse signal in accordance with the envelope of the modulation signal 11s1, more specifically, the pulse signal with the pulse width in accordance with magnitude of the envelope of the modulation signal 11s1. Based on the switch control signal 11s2, the pulse switch 162 outputs any one of the constant voltage generation pulse signal 11s4 and the fluctuation voltage generation pulse signal 161s to the switching amplifier 163.

Specifically, in the transmission time period Ts, the pulse switch 162 sends the output (fluctuation voltage generation pulse signal 161s) of the fluctuation voltage generation pulse signal generation unit 161 to the switching amplifier 163. The fluctuation voltage generation pulse signal 161s is the pulse signal for ET voltage generation. In the receiving time period Tr, the pulse switch 162 outputs the constant voltage generation pulse signal 11s4 for constant voltage generation to the switching amplifier 163.

More specifically, in the transmission time period Ts, the switch control signal 11s2 is set to "1". If the switch control signal 11s2 is "1", the pulse switch 162 outputs the fluctuation voltage generation pulse signal 161s. In the receiving time period Tr, the switch control signal 11s2 is set to "0". If the switch control signal 11s2 is "0", the pulse switch 162 outputs the constant voltage generation pulse signal 11s4. The pulse switch 162 selects one of the pulse signal for ET voltage generation and the pulse signal for constant voltage generation in accordance with the switch control signal 11s2, and outputs the selected signal to the switching amplifier 163.

The switching amplifier 163 receives constant voltage power supply from the battery 51. Upon input of the fluctuation voltage generation pulse signal 161s, the switching amplifier 163 generates and outputs the ET voltage that follows the envelope signal 11s3. Upon input of the constant voltage generation pulse signal 11s4, the switching amplifier 163 generates and outputs the constant voltage with predetermined value. As described above, the pulse width and cycle of the constant voltage generation pulse signal 11s4 are preliminarily examined, and set by the controller 11 so as to allow the switching amplifier 163 that receives the input of the constant voltage generation pulse signal 11s4 to generate the constant voltage with predetermined value. The output of the switching amplifier 163 is sent to the power switch 56 as an ET power source unit output 160a.

As described above, the power switch 56 sends the ET power source unit output 160a to the transmission power amplifier (PA) 24 in the transmission time period Ts (that is, when the switch control signal 11s2 is set to "1"), and sends the output to the receiver 30 (specifically, the receiving power amplifier 32, the receiving mixer 33, and the demodulator 34) in the receiving time period Tr (that is, when the switch control signal 11s2 is set to "0").

The fluctuation voltage generation pulse signal generation unit 161 will be described in detail.

The fluctuation voltage generation pulse signal generation unit 161 includes a DAC 161a, a triangular wave generation circuit 161b, and a comparator 161c. The DAC 161a is a digital/analog converter which converts the envelope signal 11s3 derived from the controller 11 into the analog signal, and outputs the signal to the comparator 161c. The triangular wave generation circuit 161b periodically generates the triangular wave with constant amplitude so as to be output with repetition. The comparator 161c generates the fluctuation voltage generation pulse signal 161s based on the analog-converted envelope signal 11s3 from the DAC 161a, and the triangular wave signal from the triangular wave generation circuit 161b, and outputs the signal to the pulse switch 162.

The fluctuation voltage generation pulse signal 161s is a rectangular pulse with repetition at the same cycle as the triangular wave signal, which increases the pulse width as the output level of the DAC 161a becomes higher, that is, the envelope signal 11s3 becomes larger.

The switching amplifier 163 is configured to have an additional capacitor for output of a known class-D amplifier so as to obtain smooth output. In accordance with magnitude of the pulse width of the input signal, the switching amplifier 163 fluctuates its output level. In other words, as the pulse width of the input signal becomes large, the output level is heightened. As the pulse width of the input signal becomes small, the output level is lowered. The switching amplifier 163 is capable of receiving outputs that follow the envelope signal 11s3, in other words, the output (ET power source unit output 160a) in accordance with the envelope signal 11s3.

Figure 4:
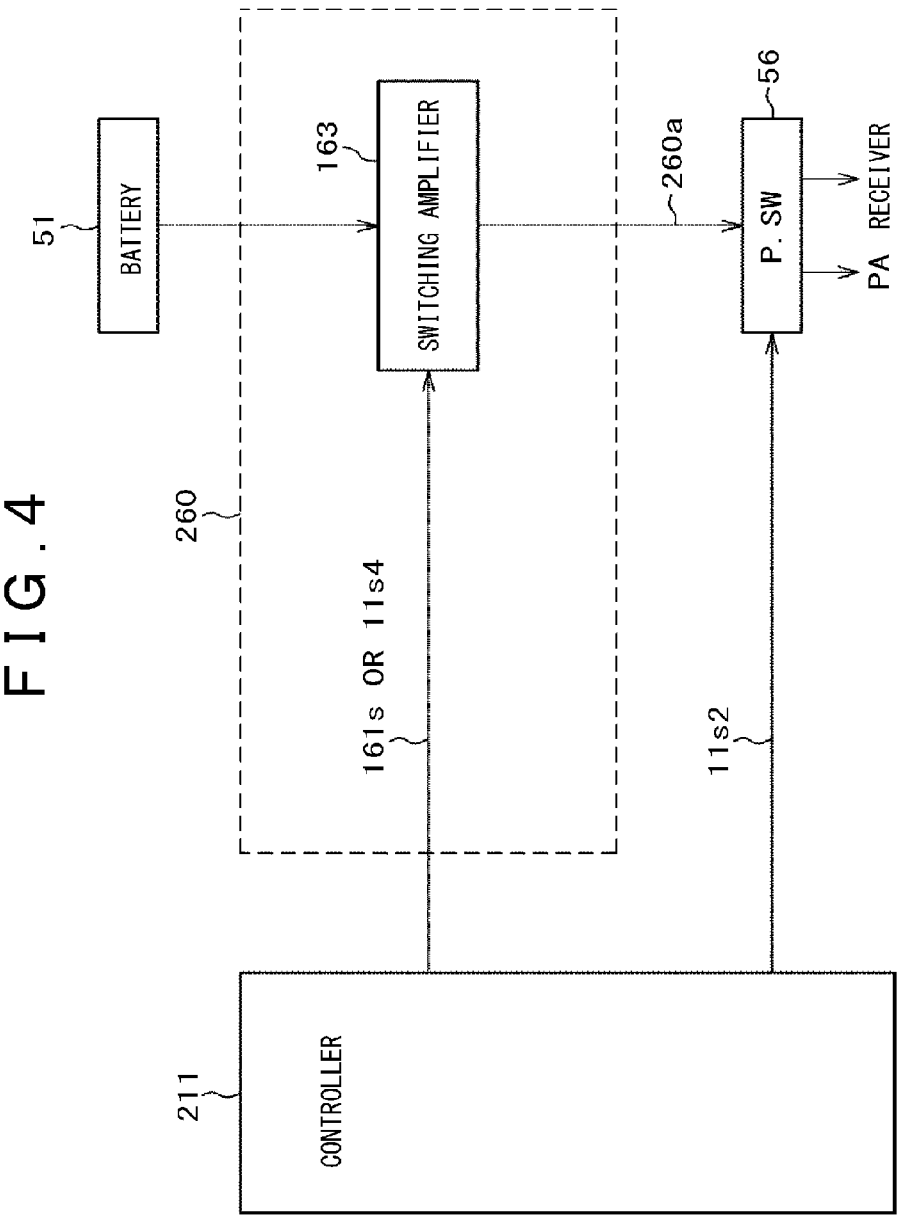
FIG. 4 is a block diagram of the ET power source unit as a second example according to the embodiment of the present invention.

FIG. 4 is a block diagram of the ET power source unit according to a second example of the embodiment.

Referring to FIG. 4, an ET power source unit 260 according to the second example corresponds to the ET power source unit 60 as shown in FIG. 1, which includes the switching amplifier 163. That is, the ET power source unit 260 according to the second example is constituted by the ET power source unit 160 according to the first example except the fluctuation voltage generation pulse signal generation unit 161 and the pulse switch 162. Functions of the fluctuation voltage generation pulse signal generation unit 161 and the pulse switch 162 according to the first example are included in a controller 211 according to the second example. That is, the controller 211 according to the second example is constituted by adding functions of the fluctuation voltage generation pulse signal generation unit 161 and the pulse switch 162 according to the first example to the controller 11 according to the first example. The structures and signals which are the same as those shown in FIGS. 1 and 3 will be designated with the same codes, and explanations thereof, thus will be omitted.

The ET power source unit 260 obtains the switch control signal 11s2, the fluctuation voltage generation pulse signal 161s, and the constant voltage generation pulse signal 11s4 from the controller 211. As described in the first example, the fluctuation voltage generation pulse signal 161s is the pulse signal for the ET voltage generation used in the transmission time period Ts. The constant voltage generation pulse signal 11s4 is the pulse signal for constant voltage generation used in the receiving time period Tr.

The controller 211 does not output the constant voltage generation pulse signal 11s4 in the transmission time period Ts, but outputs the fluctuation voltage generation pulse signal 161s to the switching amplifier 163. In the receiving time period Tr, the controller does not output the fluctuation voltage generation pulse signal 161s, but outputs the constant voltage generation pulse signal 11s4 to the switching amplifier 163.

Likewise the first example, in the transmission time period Ts, the ET voltage that follows the envelope signal 11s3 is output as an ET power source unit output 260a. In the receiving time period Tr, the constant voltage with predetermined value is output as the ET power source unit output 260a.

The ET power source unit 260 according to the second example executes the output operation similar to the ET power source unit 160 according to the first example. The second example is configured by omitting the fluctuation voltage generation pulse signal generation unit 161 and the pulse switch 162 of the first example. Upon use of LSI (Large Scale Integration) and FPGA for constituting the controller 211, the second example makes it possible to reduce the hardware structure size smaller than the one according to the first example.

Figure 5:
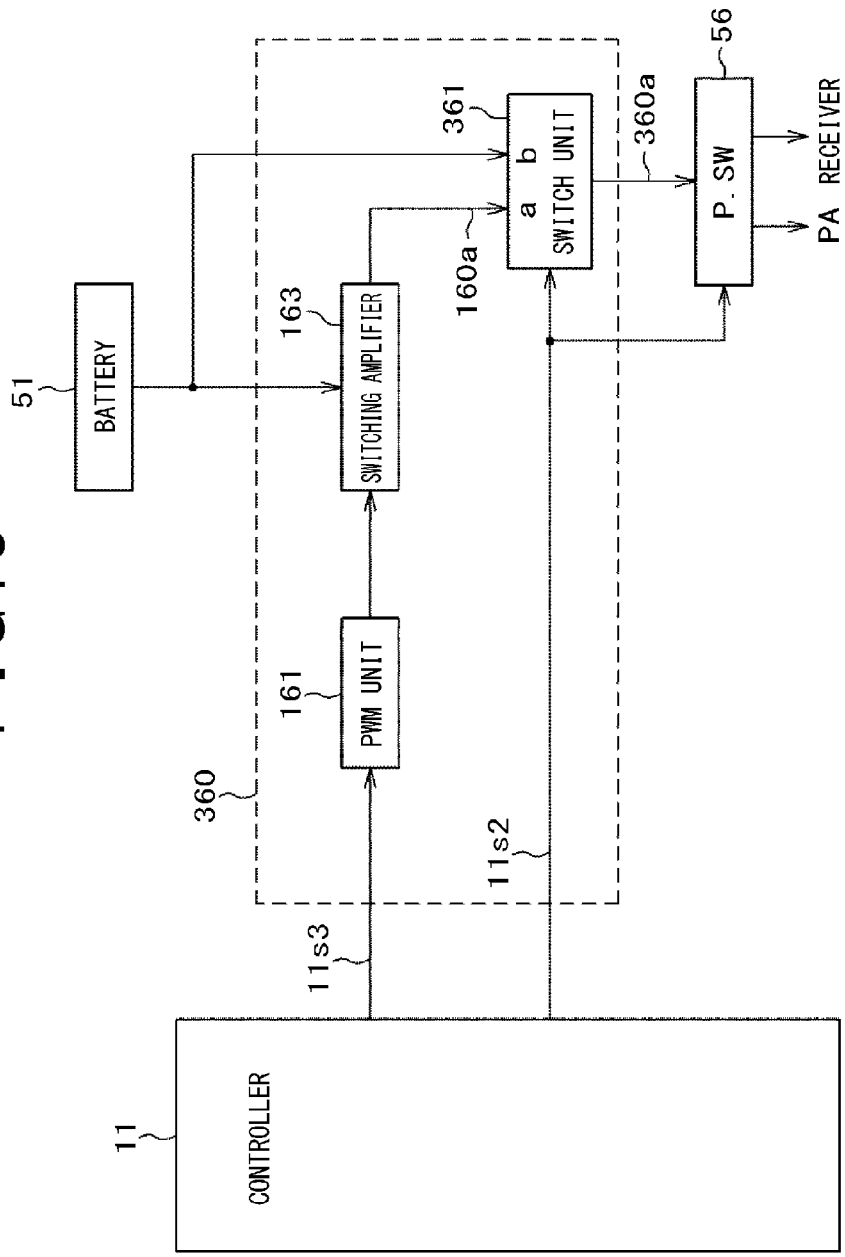
FIG. 5 is a block diagram of the ET power source unit as a third example according to the embodiment of the present invention.

FIG. 5 is a block diagram of an ET power source unit according to a third example of the embodiment.

As FIG. 5 shows, an ET power source unit 360 according to the third example corresponds to the ET power source unit 60 as shown in FIG. 1, and includes the fluctuation voltage generation pulse signal generation unit 161, the switching amplifier 163, and a switch unit 361. In other words, the structure of the ET power source unit 360 according to the third example is formed by omitting the pulse switch 162 from the ET power source unit 160 according to the first example, and adding the switch unit 361 thereto. The switch unit 361 is configured to switch the output between the output 160a of the switching amplifier 163 and the output of the battery 51, and to send the switched output. The structures and signals which are the same as those shown in FIGS. 1 and 3 will be designated with the same codes, and explanations thereof, thus will be omitted.

The ET power source unit 360 obtains the switch control signal 11s2 and the envelope signal 11s3 from the controller 11. The switch unit 361 is configured to output any one of an input a and an input b in accordance with the switch control signal 11s2. Specifically, the switch unit outputs the input "a" if the switch control signal 11s2 is set to "1" (that is, in the transmission time period Ts), and outputs the input "b" if the switch control signal 11s2 is set to "0" (that is, in the receiving time period Tr).

That is, the switch unit 361 sends the output 160a (input a) of the switching amplifier 163 as the ET voltage to the power switch 56 in the transmission time period Ts, and sends the output (input b) of the battery 51 as the constant voltage to the power switch 56 in the receiving time period Tr.

Likewise the first example, in the transmission time period Ts, the ET voltage that follows the envelope signal 11s3 is sent as an ET power source unit output 360a, and in the receiving time period Tr, the constant voltage with predetermined value is sent as the ET power source unit output 360a.

The ET power source unit output 360a to be output in the receiving time period Tr has the voltage value corresponding to the output voltage of the battery 51. The ET power source unit output 360a is supplied to the receiver 30 via the power switch 56. It is possible to provide a voltage conversion unit at an intermediate position of the power supply line from the power switch 56 to the receiver 30 so as to meet the requirement of making the voltage supplied to the receiver 30 different from the output voltage of the battery 51. The voltage conversion unit may be constituted by the known DC/DC converter, for example. Alternatively, it is also possible to connect the input b of the switch unit 361 not to the output of the battery 51 but to the output of the power source device with desired output voltage value (that is, voltage supplied to the receiver 30).

Figure 6:
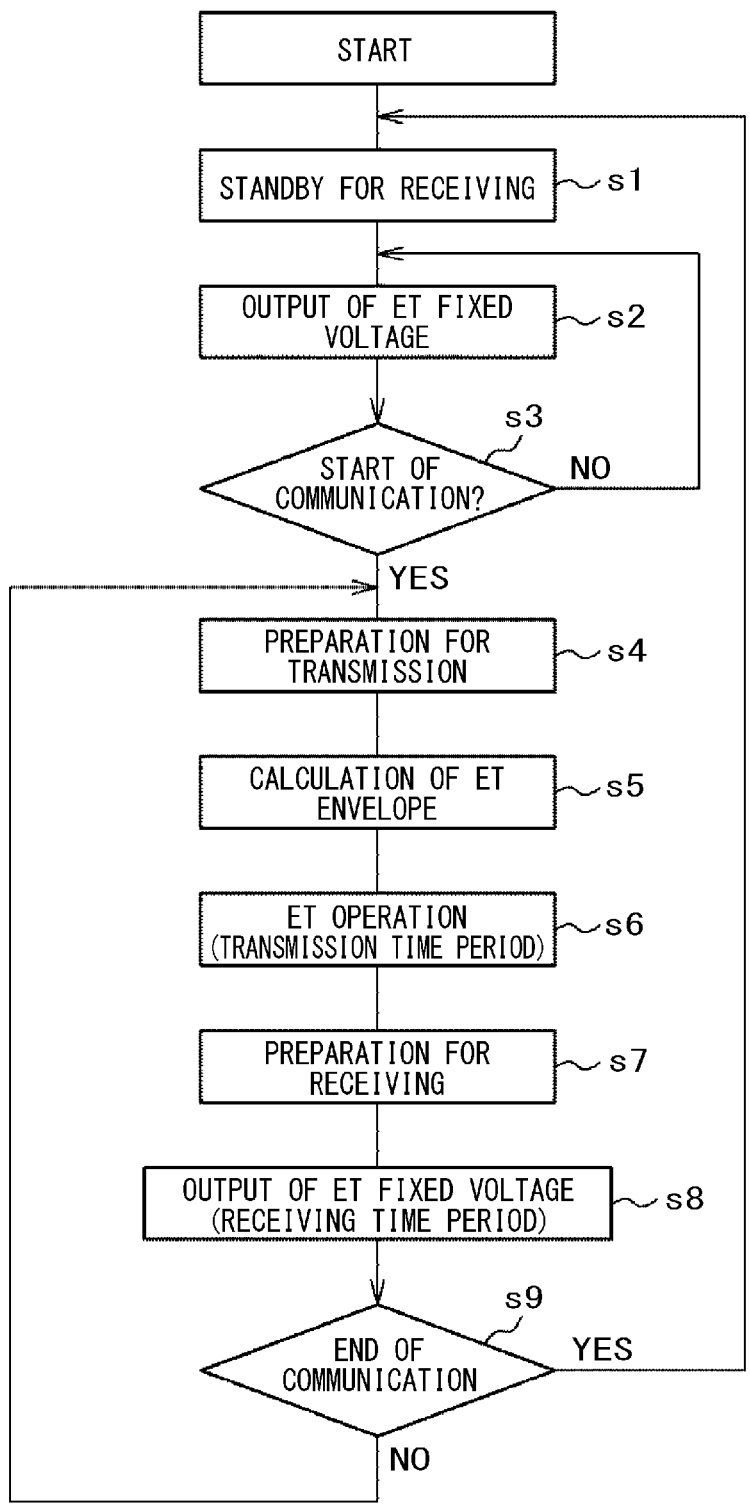
FIG. 6 is a flowchart of the process executed for the wireless communication device according to the embodiment of the present invention.

FIG. 6 is a flowchart for processing of the wireless communication device according to the embodiment of the present invention. The operation of the wireless communication device 10 is controlled by the controller 11 in accordance with the processing flow. In the process, the ET power source unit 160 according to the first example is employed as the ET power source unit 60. The processing flow starts in the receiving standby state. Upon transition from the receiving standby state to the communication state, the transmission state and the receiving state will be repeated until the end of communication. The receiving standby state represents the state waiting for receiving the wireless signal from the other wireless communication device and the base station apparatus.

First, in the receiving standby state (step S1 as shown in FIG. 6), the ET power source unit 160 outputs a predetermined fixed voltage value (step S2). In the receiving standby state, the ET power source unit 160 is operated correspondingly to the receiving time period Tr, and the ET power source unit output 160a is set to the predetermined fixed voltage value. The receiving standby state will last until start of the communication (No in step S3), and the ET power source unit output 160a has the predetermined fixed voltage value.

Thereafter, upon pressing of a PTT button of the audio input/output unit 12, for example, the communication starts to be brought into the communication state (Yes in step S3). When the communication state is in the gap time Tg, and then in the transmission time period Ts, transmission of data such as sounds starts. In the gap time Tg, preparation is made for transmission (step S4).

At this time, as a step of preparation for transmission, based on the I signal and the Q signal of the transmission data, the controller 11 calculates each envelope of the I and Q signals (step S5). In the transmission time period Ts, the envelope signal 11s3 is output from the controller 11 to the ET power source unit 160. Then the ET power source unit 160 executes ET operation (step S6). That is, the ET power source unit 160 outputs the ET voltage that follows the envelope signal 11s3.

In the gap time Tg subsequent to the end of the transmission time period Ts, preparation is made for receiving (step S7). As a step of preparation for receiving, the constant voltage generation pulse signal 11s4 is generated so as to bring the output 160a of the ET power source unit 160 into the voltage with predetermined value, and the generated signal is output from the controller 11 to the ET power source unit 160. The ET power source unit 160 then outputs the predetermined fixed voltage. In the receiving time period Tr subsequent to the end of the gap time, the ET power source unit 160 outputs the predetermined fixed voltage (step S8).

Thereafter, if the communication does not end (No in step S9), the process returns to the transmission preparation in step S4 so that the controller 11 calculates each envelope of the I signal and Q signal in the gap time Tg (step S5). The operation state moves into the transmission time period Ts (step S6). If the communication ends (Yes in step S9), the process returns to the receiving standby state in step S1.

As described above, in the example as shown in FIG. 6, the ET power source unit output 160a keeps the predetermined fixed voltage value until start of transmission from the receiving standby state. When the operation state moves into the transmission time period Ts, the ET power source unit output 160a varies into the ET voltage that follows the envelope signal 11s3. Then in the gap time Tg subsequent to the end of the transmission time period Ts, the ET power source unit output 160a varies into the predetermined fixed voltage value. When the operation state moves into the transmission time period Ts subsequent to the receiving time period Tr and the gap time Tg, the ET power source unit output 160a varies into the ET voltage that follows the envelope signal 11s3.

The embodiment provides at least the following effects.
(a) The wireless communication device includes a transmitter which includes an orthogonal modulator that orthogonally modulates an IQ-modulated modulation signal, and a transmission power amplifier that power-amplifies the orthogonally modulated signal, a receiver which includes a demodulator that demodulates a received signal and outputs a demodulation signal, a first power source serving as a power source for the transmission power amplifier and the receiver, a second power source serving as a power source for the orthogonal modulator, and a controller which outputs the modulation signal to the orthogonal modulator, to which the demodulation signal is input from the demodulator. The first power source outputs a constant voltage to the receiver in the receiving time period, and, in the transmission time period, outputs a fluctuation voltage in accordance with an envelope of the modulation signal to the transmission power amplifier. This makes it possible to lessen power consumption of the wireless communication device while suppressing increase in the space occupied by the power source unit.
(b) The first power source includes a switching amplifier which outputs a voltage in accordance with a pulse width of an input pulse signal, by which an output of the first power source is generated. In the transmission time period, a fluctuation voltage generation pulse signal serving as a pulse signal for generating the fluctuation voltage is input to the switching amplifier, from which the fluctuation voltage is output. This makes it possible to implement the first power source with ease.
(c) The first power source includes a fluctuation voltage generation pulse signal generation unit for generating and outputting the fluctuation voltage generation pulse signal. This makes it possible to simplify the structure of the component except the first power source.
(d) The first power source includes a pulse switch which outputs any one of a constant voltage generation pulse signal for generating the constant voltage to be output to the receiver, and the fluctuation voltage generation pulse signal to the switching amplifier. The pulse switch outputs the fluctuation voltage generation pulse signal in the transmission time period, and outputs the constant voltage generation pulse signal in the receiving time period. The switching amplifier outputs the fluctuation voltage in the transmission time period, and outputs the constant voltage in the receiving time period. This makes it possible to implement the first power source with ease.
(e) The controller outputs an identification signal indicating whether or not time corresponds to the transmission time period to the first power source, outputs an envelope signal to the first power source in the transmission time period, and, in the receiving time period, outputs the constant voltage generation pulse signal to the first power source. The fluctuation voltage generation pulse signal generation unit generates the fluctuation voltage generation pulse signal based on the envelope signal. The pulse switch outputs the fluctuation voltage generation pulse signal in the transmission time period, and outputs the constant voltage generation pulse signal in the receiving time period based on the identification signal. This makes it possible to implement the wireless communication device with simplified structure.
(f) A gap time is set between the transmission time period and the receiving time period. The first power source switches its output from the fluctuation voltage to the constant voltage in the gap time immediately after the transmission time period, and switches the output from the constant voltage to the fluctuation voltage in the gap time immediately after the receiving time period. This makes it possible to easily execute the switching operation between the fluctuation voltage and the constant voltage.

It is to be easily understood that the present invention is not limited to the above-described embodiment, but may be arbitrarily modified so along as it does not deviate from the scope of the present invention.

The embodiment has been exemplified by the wireless communication device operated in the transmission time period and the receiving time period alternately with repetition. The present invention is not limited to the wireless communication device as described above. For example, the embodiment may be implemented as the device configured so that a first time period and a second time period do not overlap, to which a fluctuation signal having its value fluctuated, and a switching signal indicating the first time period are input so that, based on the switching signal, the fluctuation voltage value in accordance with the fluctuation signal is output in the first time period, and the constant voltage value is output in the second time period.

The embodiment is configured to provide the gap time. However, it is also possible not to provide the gap time. In such a case, the envelope used for the next transmission time period may be calculated in the receiving time period immediately before the next transmission time period.

The present invention may also be considered implementable as the power source device to which the fluctuation signal having its value fluctuated and a switching signal are input so as to switch the voltage between the fluctuation voltage that fluctuates its value in accordance with the fluctuation signal, and the constant voltage based on the switching signal, and outputs the switched voltage.

The present invention may be considered implementable as not only the device but also the method for executing the process corresponding to the present invention. Alternatively, the present invention may be considered implementable as the program for executing the method, and the recording medium for recording such program.

From a structural perspective of the wireless communication device, the present invention is applicable to various types of frequency. In case of the TDD system, it may be utilized as the hardware architecture of the multiband radio unit in the software defined radio environment. Furthermore, the present invention may be utilized as the hardware architecture of the white space (secondary use) radio unit which has been attracting attention lately.

REFERENCE SIGNS LIST

10: wireless communication device,
11: controller,
11s1: modulation signal,
11s2: switch control signal (identification signal),
11s3: envelope signal,
11s4: constant voltage generation pulse signal,
12: audio input/output unit,
13: operation display unit,
14: storage unit,
20: transmitter,
21: orthogonal modulator (MOD),
22: transmission mixer (transmission MIX),
23: preamplifier (AMP),
24: transmission power amplifier (PA),
25: isolator (ISO),
26: transmission filter (transmission FIL),
27: transmission PLL,
28: transmission VCO,
30: receiver,
31: receiving filter (receiving FIL),
32: receiving power amplifier (LNA),
33: receiving mixer (receiving MIX),
34: demodulator (DEMO),
35: receiving PLL,
36: receiving VCO,
41: antenna switch (A.SW),
42: transmission/receiving antenna,
43: TCXO,
51: battery,
52: transmission power source unit,
53: control power source unit,
56: power switch (P.SW),
60: ET power source unit,
60a: ET power source unit output,
160: ET power source unit,
160a: ET power source unit output,
161: fluctuation voltage generation pulse signal generation unit (PWM unit),
161a: DAC,
161b: triangular wave generation circuit,
161c: comparator,
161s: fluctuation voltage generation pulse signal,
162: pulse switch (PWM switch unit),
163: switching amplifier,
211: controller,
260: ET power source unit,
260a: ET power source unit output,
360: ET power source unit,
360a: ET power source unit output,
361: switch unit

The invention claimed is:

1. A wireless communication device configured to prevent a transmission time period for sending a wireless signal and a receiving time period for receiving a wireless signal from being overlapped, comprising:
   a transmitter which includes an orthogonal modulator that orthogonally modulates an IQ-modulated modulation signal, and a transmission power amplifier that power-amplifies the orthogonally modulated signal;
   a receiver which includes a demodulator that demodulates a received signal and outputs a demodulation signal;
   a first power source serving as a power source for the transmission power amplifier and the receiver;
   a second power source serving as a power source for the orthogonal modulator; and
   a controller which outputs the modulation signal to the orthogonal modulator, to which the demodulation signal is input from the demodulator,
   wherein the controller further outputs an identification signal indicating whether or not time corresponds to the transmission time period to the first power source, outputs a constant voltage generation pulse signal to the first power source in the receiving time period, and outputs an envelope signal indicating an envelope of the modulation signal to the first power source in the transmission time period,
   wherein the first power source outputs a constant voltage to the receiver in the receiving time period and outputs a fluctuation voltage in the transmission time period in accordance with the envelope of the modulation signal to the transmission power amplifier,
   wherein the first power source includes:
      a fluctuation voltage generation pulse signal generation unit for generating the fluctuation voltage generation pulse signal based on the envelope signal,
      a pulse switch which outputs the constant voltage generation pulse signal in the receiving time period and outputs the fluctuation voltage generation pulse signal in the transmission time period, and
      a switching amplifier which outputs the constant voltage in the receiving time period in accordance with a pulse width of the constant voltage generation pulse signal and outputs the fluctuation voltage in the transmission time period in accordance with a pulse width of the fluctuation voltage generation pulse signal.

2. The wireless communication device according to claim 1, wherein:
   a gap time is set between the transmission time period and the receiving time period, and the first power source switches from outputting the fluctuation voltage to the constant voltage in the gap time after the transmission time period, and switches from outputting the constant voltage to the fluctuation voltage in the gap time after the receiving time period.

* * * * *